(12) United States Patent
Shimizu (10) Patent No.: US 11,244,875 B2
(45) Date of Patent: Feb. 8, 2022

(54) SEMICONDUCTOR DEVICE AND MANUFACTURING METHOD FOR SEMICONDUCTOR DEVICE

(71) Applicant: Mitsubishi Electric Corporation, Tokyo (JP)

(72) Inventor: Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 3 days.

(21) Appl. No.: 16/558,482

(22) Filed: Sep. 3, 2019

(65) Prior Publication Data

US 2020/0185287 A1    Jun. 11, 2020

(30) Foreign Application Priority Data

Dec. 6, 2018  (JP) .............................. JP2018-228965

(51) Int. Cl.
*H01L 23/053*   (2006.01)
*H01L 23/00*    (2006.01)
(Continued)

(52) U.S. Cl.
CPC ........ *H01L 23/053* (2013.01); *H01L 21/4846* (2013.01); *H01L 23/08* (2013.01); *H01L 24/48* (2013.01); *H01L 24/32* (2013.01); *H01L 24/73* (2013.01); *H01L 25/0655* (2013.01); *H01L 2224/32225* (2013.01); *H01L 2224/48091* (2013.01); *H01L 2224/48101* (2013.01); *H01L 2224/48106* (2013.01); *H01L 2224/48137* (2013.01); *H01L 2224/48157* (2013.01); *H01L 2224/73265* (2013.01); *H01L 2924/1033* (2013.01); *H01L 2924/10253* (2013.01); *H01L 2924/10272* (2013.01)

(58) Field of Classification Search
None
See application file for complete search history.

(56) References Cited

U.S. PATENT DOCUMENTS 5,793,106 A * 8/1998 Yasukawa ........... H01L 23/3121
                                              257/706
2009/0003003 A1* 1/2009 Park ..................... H01L 33/642
                                              362/373
(Continued)

FOREIGN PATENT DOCUMENTS

EP    0 928 026 A1    7/1999
JP    H11-176966 A    7/1999
(Continued)

OTHER PUBLICATIONS

An Office Action; "Notice of Reasons for Refusal", mailed by the Japanese Patent Office dated Nov. 16, 2021, which corresponds to Japanese Patent Application No. 2018-228965 and is related to U.S. Appl. No. 16/558,482; with English language translation.

*Primary Examiner* — Khaja Ahmad
(74) *Attorney, Agent, or Firm* — Studebaker & Brackett PC (57) ABSTRACT

A semiconductor device includes a case enclosing a region where a semiconductor element as a component of an electric circuit exists. A resin part is fixed to an inside of the case in contact with the region. The resin part is provided with a conductive film, which is a part of the electric circuit. The conductive film is provided in the resin part so that the conductive film comes into contact with the region.

14 Claims, 11 Drawing Sheets

(51) Int. Cl.
*H01L 21/48* (2006.01)
*H01L 23/08* (2006.01)
*H01L 25/065* (2006.01)

(56) References Cited

U.S. PATENT DOCUMENTS

| | | | | |
|---|---|---|---|---|
| 2009/0261374 | A1* | 10/2009 | Hayashi | H01L 33/62 |
| | | | | 257/99 |
| 2013/0176689 | A1* | 7/2013 | Nishimura | H05K 7/02 |
| | | | | 361/739 |
| 2015/0263145 | A1* | 9/2015 | Pala | H01L 29/66333 |
| | | | | 257/77 |
| 2015/0332982 | A1* | 11/2015 | Ono | H01L 23/49586 |
| | | | | 257/676 |
| 2016/0071778 | A1* | 3/2016 | Otsubo | H01L 21/52 |
| | | | | 257/687 |
| 2016/0155706 | A1* | 6/2016 | Yoneyama | H01L 23/552 |
| | | | | 257/77 |
| 2016/0307817 | A1* | 10/2016 | Kimura | H01L 23/10 |
| 2017/0006721 | A1 | 1/2017 | Soyano | |
| 2019/0348402 | A1 | 11/2019 | Soyano | |

FOREIGN PATENT DOCUMENTS

| | | |
|---|---|---|
| JP | 2004-039807 A | 2/2004 |
| JP | 2005-32779 A | 2/2005 |
| JP | 2009-283898 A | 12/2009 |
| JP | 2017-017195 A | 1/2017 |
| WO | 2015/008860 A1 | 1/2015 |

\* cited by examiner

SEMICONDUCTOR DEVICE AND MANUFACTURING METHOD FOR SEMICONDUCTOR DEVICE

BACKGROUND OF THE INVENTION

Field of the Invention

The present invention relates to a semiconductor device having a configuration utilizing a case, and a manufacturing method for the semiconductor device.

Description of the Background Art

As a formation technique of a wiring pattern in a semiconductor device, there has been known a technique disclosed in Japanese Patent Application Laid-Open No. 2005-032779 (hereinafter, also referred to as a "related art A").

In the related art A, the wiring pattern is formed in a package body. Therefore, a product having a package small in size, and mass-produced is advantageous in cost, so that a low cost can be realized.

However, when the related art A is applied to various kinds of products, and small-lot products, and products large in size such as, for example, semiconductor devices for electric power, the wiring pattern needs to be changed for each product. Therefore, there is a problem that the cost of the semiconductor device as a product is increased.

SUMMARY

An object of the present invention is to provide a semiconductor device capable of reducing a cost of the semiconductor device, as compared with a cost of a conventional semiconductor device.

A semiconductor device according to one aspect to the present invention includes a case that encloses a region where at least a first member as a component of an electric circuit exists, wherein a resin part made of resin is fixed to an inside of the case, the inside being in contact with the region, the resin part is provided with a conductive film, which is a part of the electric circuit, and the conductive film is provided in the resin part so that the conductive film comes into contact with the region.

According to the present invention, the semiconductor device includes the case that encloses the region where at least the first member as the component of the electric circuit exists. The resin part is fixed to the inside of the case, the inside being in contact with the region. The resin part is provided with the conductive film, which is a part of the electric circuit. The conductive film is provided in the resin part so that the conductive film comes into contact with the region.

Thereby, in the case, the wiring between the first member, and the conductive film of the resin part fixed to the inside of the case can be performed. That is, for example, the wiring conventionally performed, for example, in a substrate can be performed in the case. This can make the case of the semiconductor device smaller in size. Accordingly, a cost of the case can be reduced. As a result, the cost of the semiconductor device can be reduced, as compared with that of the conventional semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENT

Hereinafter, a preferred embodiment will be described with reference to the drawings. In the following drawings, the same components are denoted by the same reference sign. Names and functions of the components by the same reference sign are the same. Accordingly, detailed descriptions of a part of each of the components denoted by the same reference sign may be omitted.

It should be noted that dimensions, materials, and shapes of the components exemplified in the preferred embodiment, relative positions of the components, and the like may be appropriately changed according to a configuration of a device, various conditions, and the like. Moreover, the dimensions of each of the components in each of the drawings may be different from actual dimensions.

First Preferred Embodiment

Figure 1:
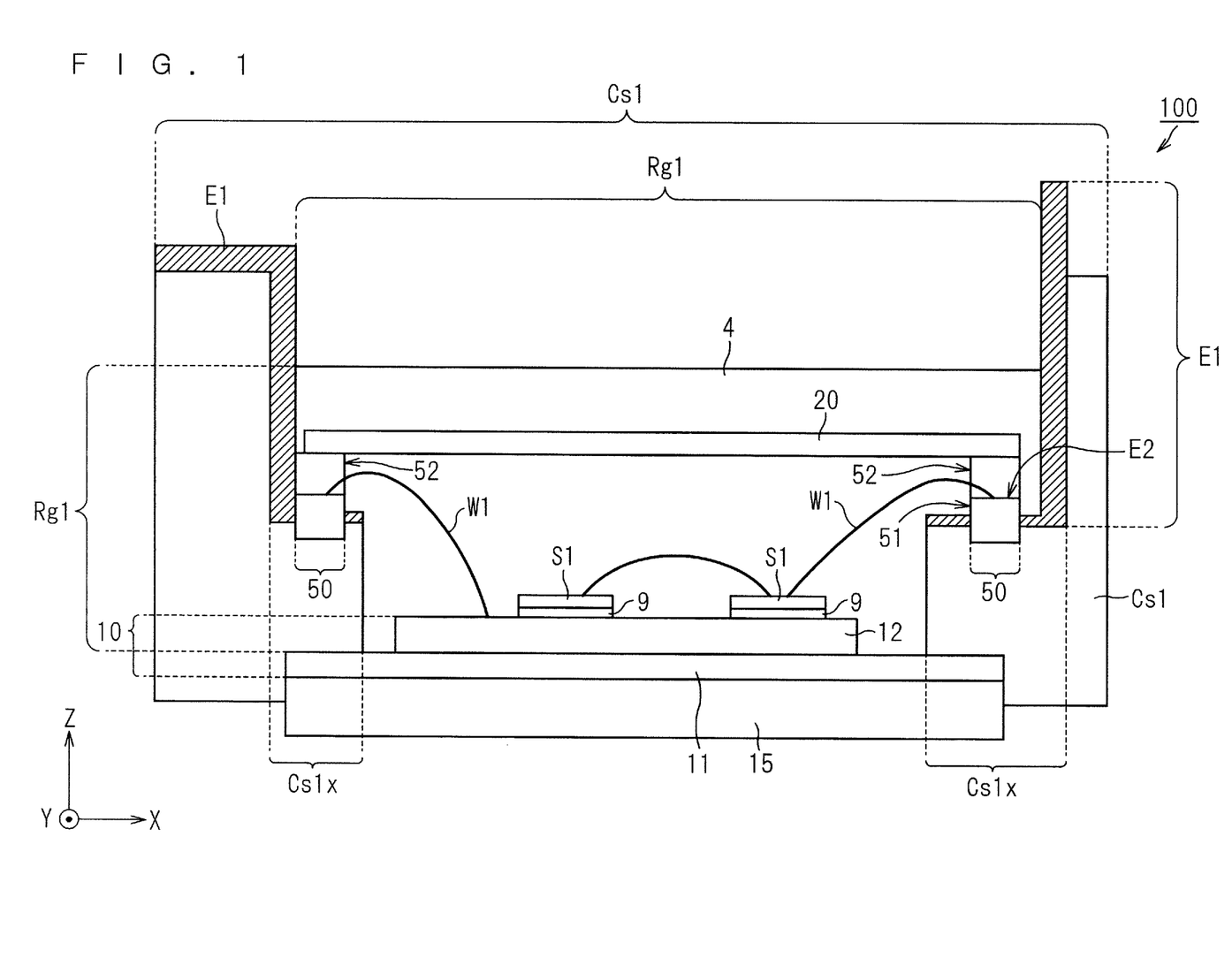
FIG. 1 is a cross-sectional view of a semiconductor device according to a first preferred embodiment.

FIG. 1 is a cross-sectional view of a semiconductor device 100 according to a first preferred embodiment. The semiconductor device 100 is utilized in fields of power generation, power transmission, efficient utilization of energy, regeneration of energy, and the like. The semiconductor device 100 is, for example, a household, industrial, vehicle, or electric train semiconductor device for electric power.

In FIG. 1, an X direction, a Y direction, and a Z direction are orthogonal to one another. The X direction, the Y direction, and the Z direction shown in the following figures are also orthogonal to one another. In the following description, a direction including the X direction and a direction opposite to the X direction (−X direction) is also referred to as an "X axis direction". Moreover, in the following description, a direction including the Y direction and a direction opposite to the Y direction (−Y direction) is also referred to as a "Y axis direction". Moreover, in the following description, a direction including the Z direction and a direction opposite to the Z direction (−Z direction) is also referred to as a "Z axis direction".

In the following description, a plane including the X axis direction and the Y axis direction is also referred to as an "XY plane". In the following description, a plane including the X axis direction and the Z axis direction is also referred to as an "XZ plane". In the following description, a plane including the Y axis direction and the Z axis direction is also referred to as a "YZ plane".

Referring to FIG. 1, the semiconductor device 100 includes a case Cs1, a plurality of electrodes E1, an insulating substrate 10, a heat sink 15, a plurality of semiconductor elements S1, and a printed substrate 20.

A shape of the case Cs1 is, for example, tubular. The shape of the case Cs1 in a plan view (XY plane) is a closed loop shape. The case Cs1 is made of resin.

Moreover, each of the electrodes E1 is fixed to the case Cs1. Each of the electrodes E1 is a main electrode made of metal. Each of the electrodes E1 is an elongated terminal.

The case Cs1 has a region Rg1, which is a space. That is, the case Cs1 encloses the region Rg1. In the region Rg1, the plurality of semiconductor elements S1, the printed substrate 20, wires W1 and the like exist. The region Rg1 is filled with a sealing material 4. Moreover, the case Cs1 has a section Cs1x. The section Cs1x is a part of the case Cs1. A shape of the section Cs1x in a plan view is a closed loop shape.

The heat sink 15 is a metal plate having heat dissipation. The insulating substrate 10 has insulation. The insulating substrate 10 is provided on the heat sink 15. The insulating substrate 10 includes an insulating layer 11 and a wiring circuit 12.

In FIG. 1, a configuration of the wiring circuit 12 is simplified. The wiring circuit 12 is a circuit plate made of metal. Specifically, in FIG. 1, the wiring circuit 12 not subjected to etching is shown. Actually, on the insulating layer 11, the wiring circuit 12 with the circuit pattern formed by etching exists.

The case Cs1 is joined to the insulating layer 11 of the insulating substrate 10, and the heat sink 15.

Each of the semiconductor elements S1 is, for example, a semiconductor chip such as a semiconductor element for electric power. The semiconductor element for electric power is, for example, a switching element, a diode, or the like. That is, the semiconductor element S1 is a member as a component of the electric circuit. The semiconductor element S1 is made of any of Si, SiC, and GaN. The semiconductor element S1 is made of, for example, SiC.

The semiconductor element S1 is electrically connected to the wiring circuit 12 through a joining material 9. The joining material 9 is, for example, solder. Although a number of the semiconductor elements S1 shown in FIG. 1 is two, actually, the number of the semiconductor element S1 included by the semiconductor device 100 is three or more. The number of the semiconductor elements S1 included by the semiconductor device 100 may be one.

Next, a characteristic configuration of the present preferred embodiment will be described. In the following description, an inside of the case Cs1 in contact with the region Rg1 is also referred to as a "case inside region". In the case inside region, the electrodes E1 are fixed.

The semiconductor device 100 further includes resin parts 50. In FIG. 1, in order to make a configuration of each of the resin parts 50 easy to understand, the relevant resin part 50 is shown on a front side of each of the electrodes E1.

Although details will be described later, the resin parts 50 made of resin are fixed to the case inside region. Each of the resin parts 50 is made of any of PPS (Polyphenylenesulfide), PC (Polycarbonate), ABS (Acrylonitrile Butadiene Styrene), PPA (Polyphthalamide), PMMA (Polymethyl methacrylate), PP (Polypropylene), TPE (Thermoplastic Elastomers), LCP (Liquid Crystal Polymer), LDPE (Low Density Polyethylene), and elastomer.

Figure 2:
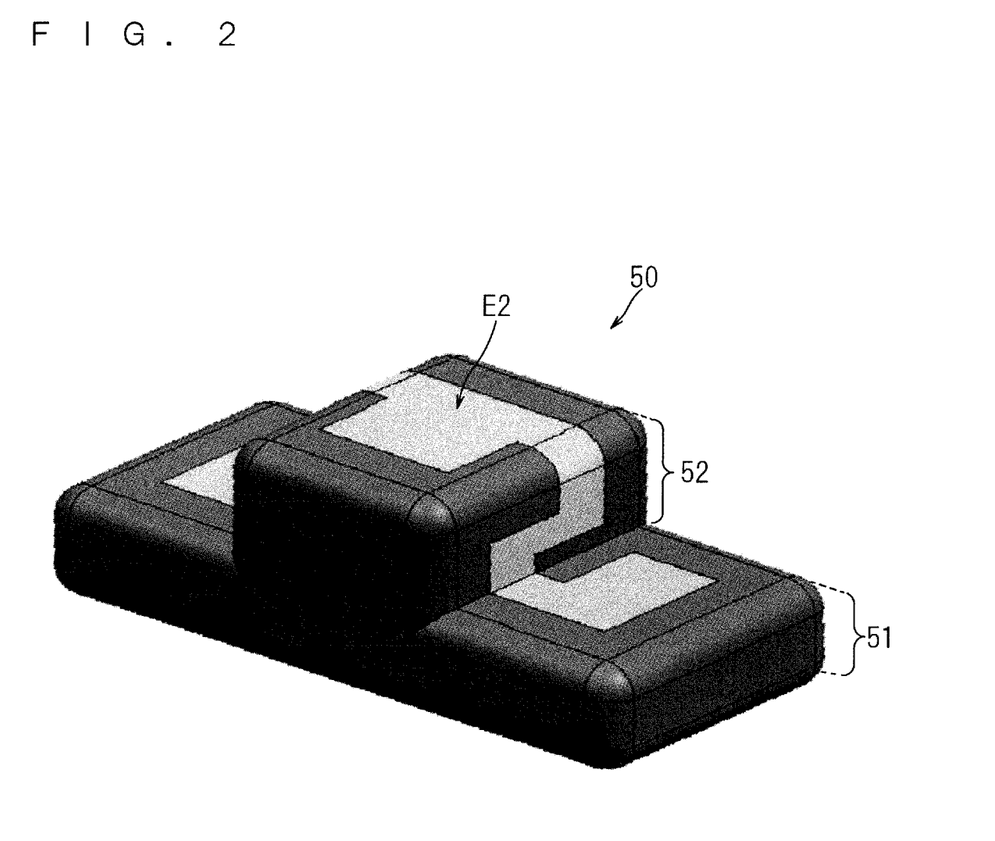
FIG. 2 is an external view of a resin part according to the first preferred embodiment.
Figure 3A:
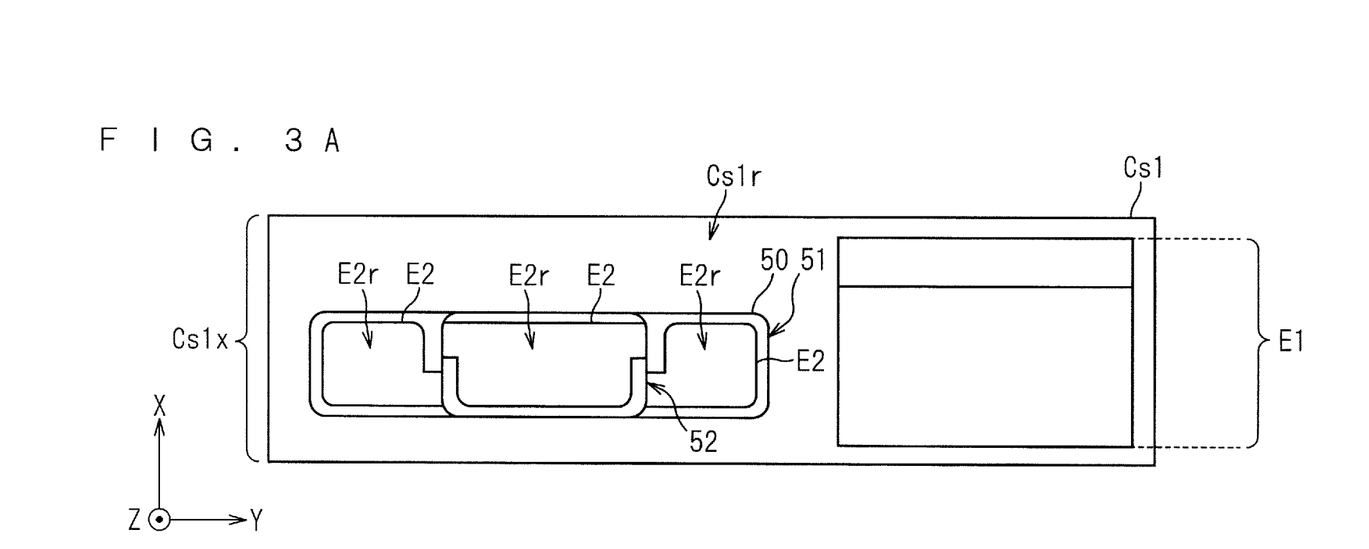
FIGS. 3A and 3B are views showing a configuration of a section of a case according to the first preferred embodiment.
Figure 3B:
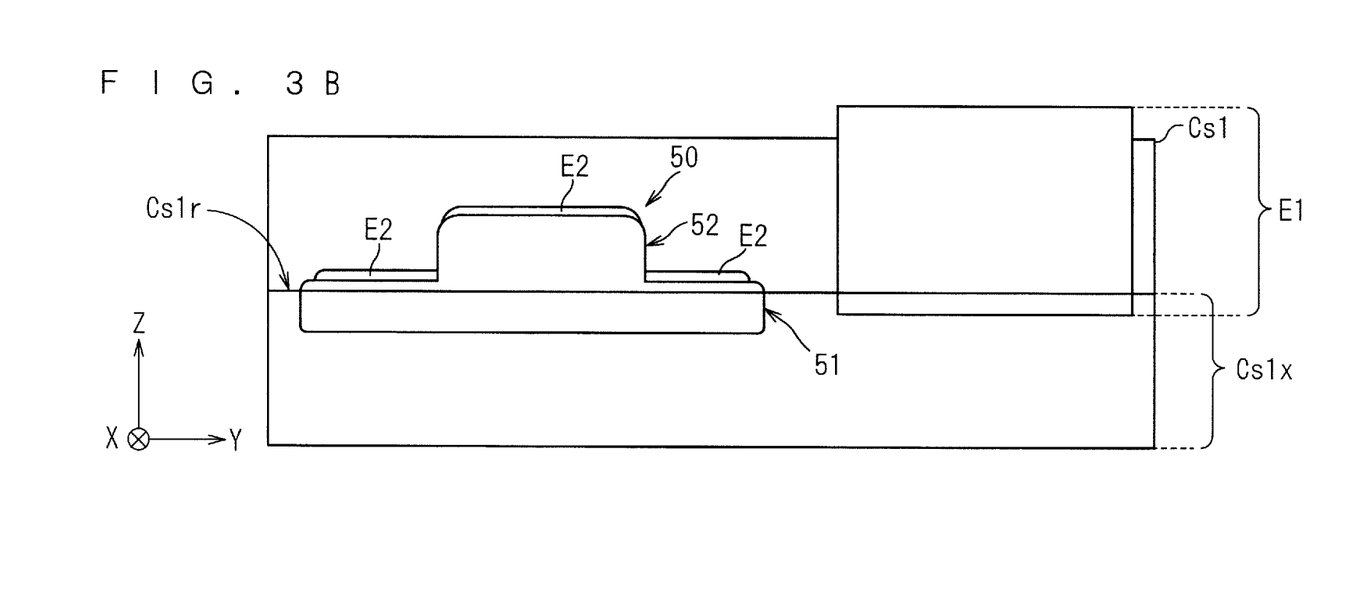

FIG. 2 is an external view of the resin part 50 according to the first preferred embodiment. FIGS. 3A and 3B are views each showing a configuration in the section Cs1x of the case Cs1 according to the first preferred embodiment. FIG. 3A is a plane view showing a configuration in the section Cs1x of the case Cs1. In FIG. 3A, a conductive film E2 described later is shown in a simplified manner, as compared with that in FIG. 2.

FIG. 3B is a side view showing the configuration in the section Cs1x of the case Cs1. In FIG. 3B, in order to make the configuration easy to understand, in regards to the section Cs1x, only an outline of the relevant section Cs1x is shown.

Referring to FIG. 2, FIGS. 3A and 3B, the section Cs1x has a flat surface Cs1r. The flat surface Cs1r of the section Cs1x is a part of the case inside region. The resin part 50 is fixed to the flat surface Cs1r of the section Cs1x.

The resin part 50 has a base portion 51 and a projecting portion 52. A shape of the base portion 51 is a plate shape. Moreover, the shape of the base portion 51 is an elongated shape. The shape of the base portion 51 may be a shape other than the elongated shape.

A part of the resin part 50 is inserted into an inside of the case Cs1. That is, a part of the resin part 50 is embedded in the case Cs1. Moreover, another part of the resin part 50 projects from the case Cs1.

Specifically, a part of the base portion 51 is embedded in the section Cs1x of the case Cs1. The whole base portion 51 may be embedded in the section Cs1x. Moreover, the projecting portion 52 projects from the section Cs1x of the case Cs1. While FIG. 3B shows a state where the whole projecting portion 52 projects from the section Cs1x, the present invention is not limited thereto. For example, a part of the projecting portion 52 may be embedded in the section Cs1x.

Moreover, in the resin parts 50, as one example, the one conductive film E2 is provided. Specifically, the relevant conductive film E2 is provided in the resin part 50 so that the relevant conductive film E2 comes into contact with the region Rg1. A state where the conductive film E2 comes into contact with the region Rg1 is a state where the relevant conductive film E2 is exposed to the relevant region Rg1. That is, the conductive film E2 is provided in a surface of the resin part 50.

The conductive film E2 is metal plating. The relevant metal plating is made of any of Cu, Ni, Ag, Au, Pd, Sn, and Cr. Cu, Ni, Ag, and Au are copper, nickel, silver, and gold, respectively. Moreover, Pd, Sn, and Cr are palladium, tin, and chrome, respectively.

Moreover, the conductive film E2 has solder regions E2r. Each of the solder regions E2r is also referred to as a soldering surface or a wire bonding area. Each of the solder regions E2r is a region for joining a member as another component of the electric circuit by solder. A member as the other component of the relevant electric circuit is, for example, the printed substrate 20, an electronic part, or the like. In the conductive film E2 of the resin part 50 shown in FIG. 3A, as one example, the three solder regions E2r exist.

Figure 4:
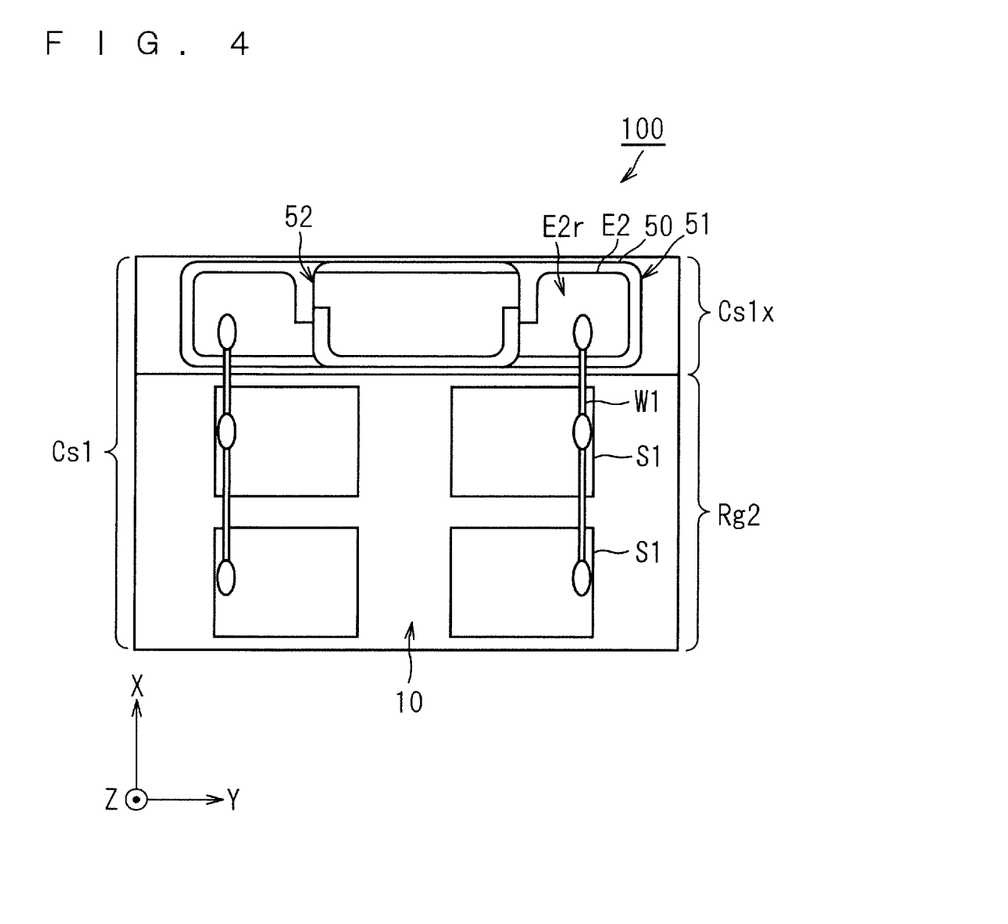
FIG. 4 is a plane view showing a peripheral configuration of the section of the case according to the first preferred embodiment.

FIG. 4 is a plane view showing a peripheral configuration in the section Cs1x of the case Cs1 according to the first preferred embodiment. Referring to FIG. 4, the conductive film E2 is electrically connected to the semiconductor elements S1 through the wires W1. In the semiconductor device 100, the electric circuit is configured of the semiconductor elements S1, the wires W1, the conductive film E2, and the like. Thus, the conductive film E2 is a part of the electric circuit configured in the semiconductor device 100. That is, the conductive film E2 is a wiring circuit as a circuit pattern.

Moreover, as one example, the projecting portion 52 can also be used for connection to the printed substrate 20. For example, as shown in FIG. 1, the projecting portions 52 of the plurality of resin parts 50 are connected to the printed substrate 20. While in FIG. 1, a state where the printed substrate 20 exists on the projecting portions 52 is shown, actually, the whole projecting portions 52 of the plurality of the resin parts 50 are inserted into holes provided in the printed substrate 20. This allows the projecting portions 52 of the plurality of resin parts 50 to be connected to the printed substrate 20.

(Manufacturing Method)

Figure 5:
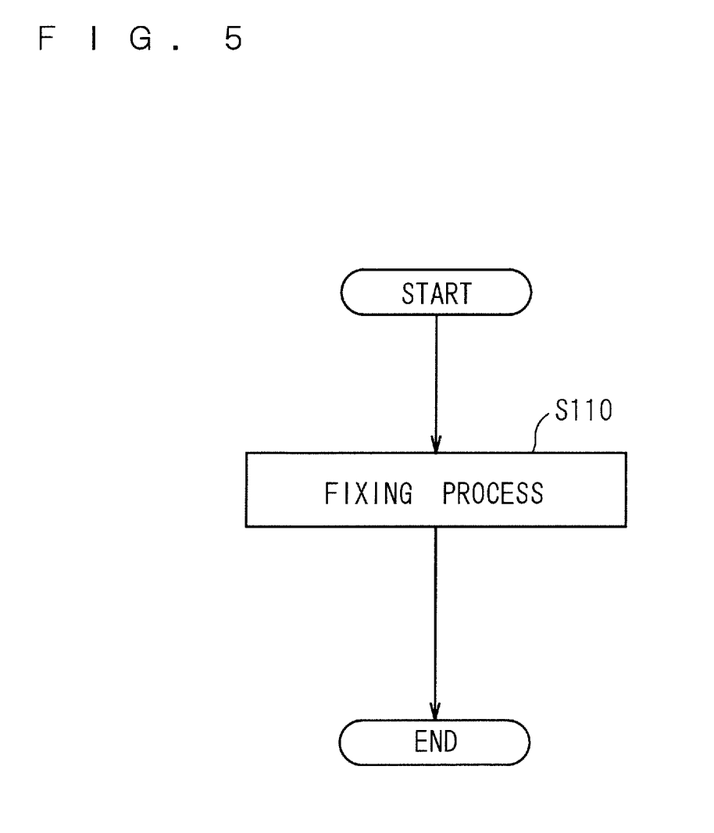
FIG. 5 is a flowchart of a manufacturing method Pr according to the first preferred embodiment.

In the following description, a manufacturing method for the semiconductor device 100 is also referred to as a "manufacturing method Pr". Next, the manufacturing method Pr will be described. FIG. 5 is a flowchart of the manufacturing method Pr according to the first preferred embodiment. In FIG. 5, only one characteristic process included in a plurality of processes of the manufacturing method Pr is shown.

In the manufacturing method Pr, a fixing process is performed in step S110. The fixing process is a process of fixing the resin parts 50 and the electrodes E1 to the case inside region by insert molding. In the fixing process, the resin parts 50 and the electrodes E1 are fixed to the case inside region simultaneously or substantially simultaneously.

Thereafter, various processes such as an assembly process, an injection process, and the like are performed, and the manufacturing of the semiconductor device 100 is completed. The injection process is a process in which the region Rg1 is filled with the sealing material 4.

(Conclusion)

As described above, according to the present preferred embodiment, the semiconductor device 100 includes the case Cs1 enclosing the region Rg1 where the semiconductor elements S1 as the components of the electric circuit. The resin parts 50 are fixed to the inside of the case Cs1 in contact with the region Rg1. Each of the resin parts 50 is provided with the conductive film E2, which is a part of the electric circuit. The conductive film E2 is provided in the resin part 50 so that the relevant conductive film E2 comes into contact with the region Rg1.

Thereby, in the case Cs1, the wiring between the semiconductor elements S1 and the conductive films E2 of the resin parts 50 fixed to the inside of the case Cs1 can be performed. That is, for example, the wiring conventionally performed, for example, in a substrate can be performed in the case Cs1. This can make the case Cs1 of the semiconductor device smaller in size. Accordingly, the cost of the case Cs1 can be reduced. As a result, the cost of the semiconductor device can be reduced, as compared with the cost of the conventional semiconductor device.

Moreover, in the present preferred embodiment, each of the resin parts 50 has the projecting portion 52. Therefore, when the process of fixing the resin parts 50 to the inside of the case Cs1 is performed, positioning of the resin parts 50 can be easily performed.

Moreover, in the present preferred embodiment, the conductive films E2 of the resin parts 50 are electrically connected to the semiconductor elements S1 through the wires W1. This allows the space inside the case Cs1 to be effectively utilized. Thus, the case Cs1 can be downsized.

Moreover, in the present preferred embodiment, the conductive film E2 of each of the resin parts 50 has the solder regions E2r. Therefore, by electrically connecting the other member to the resin part 50, the space inside the case Cs1 can be effectively utilized. Thus, the case Cs1 can be downsized.

Moreover, in the present preferred embodiment, the conductive film E2 of each of the resin parts 50 is metal plating. Therefore, in a situation where the resin part 50 is an individual part, changing a material making the metal plating corresponds to many applications.

Moreover, in the present preferred embodiment, the resin part 50 is made of any of PPS, PC, ABS, PPA, PMMA, PP, TPE, LCP, LDPE, and elastomer. That is, the resin part 50 made of the resin can suppress the manufacturing cost, as compared with a part made of metal.

Moreover, in the present preferred embodiment, the semiconductor element S1 is made of SiC (silicon carbide). Thus, a current density in the relevant semiconductor element S1 is high. Accordingly, each interval among the plurality of semiconductor elements S1 can be made large. This can reduce heat generation of each of the semiconductor elements S1.

The fixing process performed in the manufacturing method Pr of the present preferred embodiment is a process of fixing the resin parts 50 and the electrodes E1 to the case inside region by insert molding. Since in the fixing process, the insert molding is used, adhesion of the resin parts 50 and the electrodes E1 to the case inside region is increased. Accordingly, a quality of the semiconductor device 100 manufactured by the manufacturing method Pr is increased. Moreover, the fixing process using the insert molding can correspond to the resin parts having various shapes.

Figure 11:
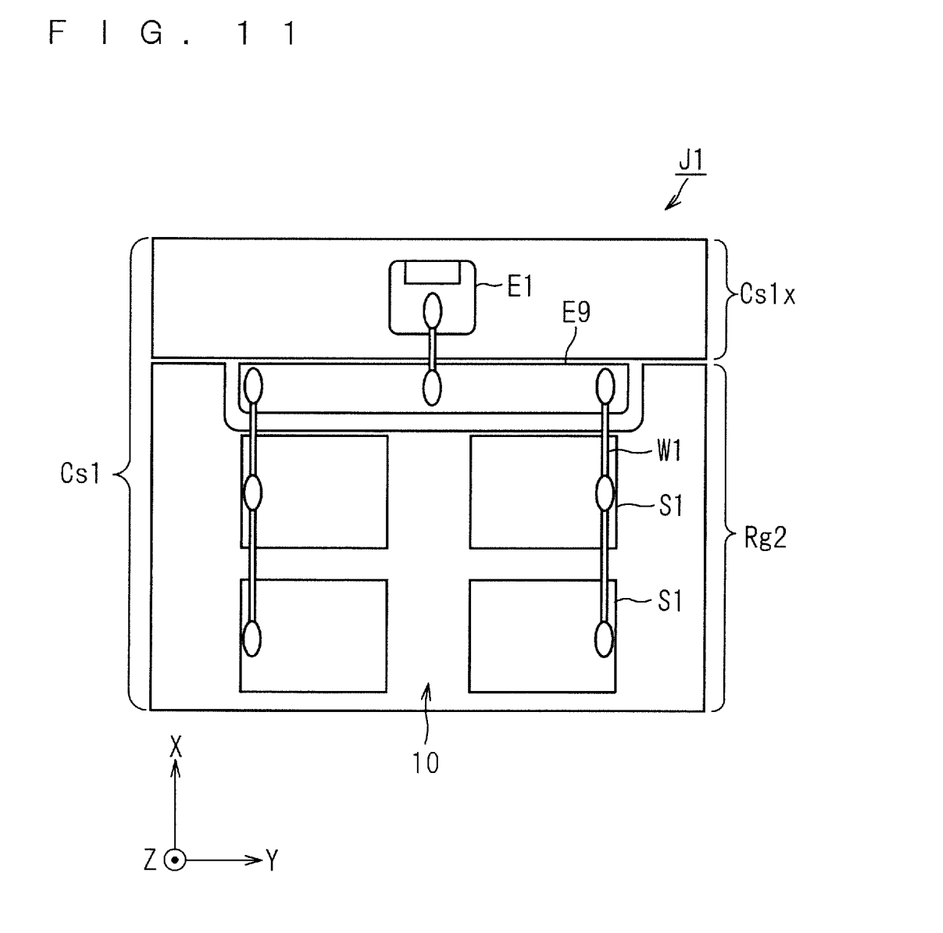
FIG. 11 is a plane view of a semiconductor device as a comparative example.

Here, a comparative example to be compared with the present preferred embodiment will be described. In the following description, a semiconductor device as a comparative example is also referred to as a "semiconductor device J1". FIG. 11 is a plane view of the semiconductor device J1 as the comparative example.

In the following description, a region that does not overlap the section Cs1x of the case Cs1 in a plan view (XY plane), and that is surrounded by the section Cs1x is also referred to as a "region Rg2". The region Rg2 is a region where the insulating substrate 10 exists.

Referring to FIG. 11, in the semiconductor device J1, a wiring circuit E9 electrically connected to the semiconductor elements S1 through the wires W1 is provided inside the region Rg2.

On the other hand, referring to FIG. 4, in the semiconductor device 100 of the present preferred embodiment, the conductive film E2 as the wiring circuit, which functions similarly to the wiring circuit E9, is provided in the section Cs1x of the case Cs1. Therefore, in the present preferred embodiment, a size of the region Rg2 can be made smaller than that in the semiconductor device J1.

Accordingly, a size of the insulating substrate 10 of the semiconductor device 100 can be made smaller than a size of the insulating substrate 10 of the semiconductor device J1. As a result, a size of the semiconductor device 100 can be made smaller than a size of the semiconductor device J1. This brings about an effect of reducing the cost of the semiconductor device 100, as compared with the cost of the semiconductor device J1.

A shape of the resin part 50 is not limited to the shape of the resin part 50 shown in FIGS. 2, 3A and 3B. The shape of the resin part 50 may be, for example, one or another shape of the two resin parts 50 in FIG. 10. Moreover, the resin part 50 may have, for example, the two or more projecting portions 52.

Moreover, a shape of the conductive film E2 may be different from a shape of the conductive film E2 shown in FIGS. 2 and 3A. The shape of the conductive film E2 may be, for example, a shape of the conductive film E2 of one or the other of the two resin parts 50 shown in FIG. 10.

First Modification

Figure 6:
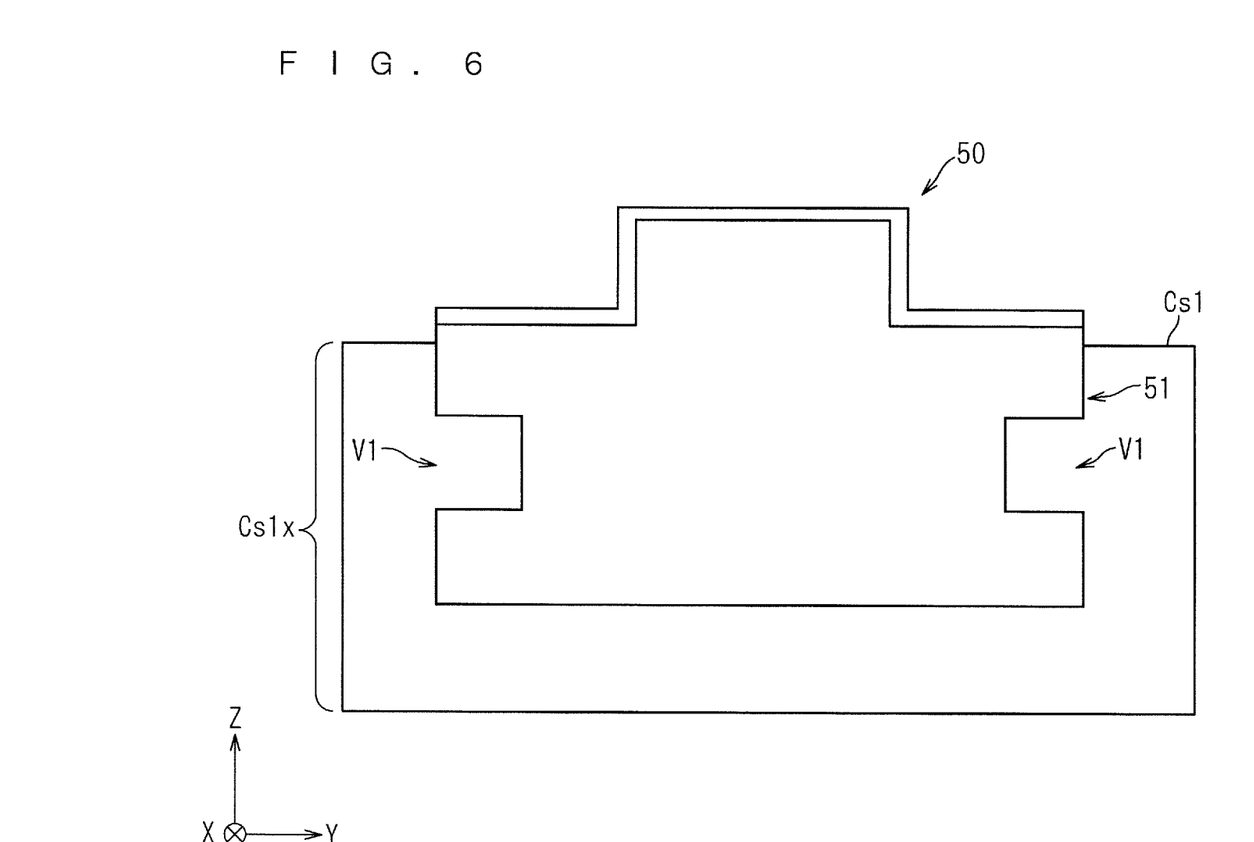
FIG. 6 is a view for describing a configuration of a first modification.

A configuration of the present modification is applied to the configuration of the first preferred embodiment. FIG. 6 is a view for describing the configuration of a first modification. In the present modification, a part of the resin part 50 embedded in the case Cs1 has a fixing portion that is fixed to a part of the case Cs1. The relevant fixing portion is grooves V1 provided in side surfaces of the resin part 50. That is, the grooves V1 are provided in the side surfaces of the resin part 50. Each of the grooves V1 is configured to be fitted in a part of the section Cs1x of the case Cs1.

As described above, according to the present modification, the adhesion of the resin part 50 to the case Cs1 can be increased. Accordingly, for example, the resin part 50 can be restrained from peeling off from the case Cs1 due to a temperature cycle test or the like.

When the foregoing fixing process of the manufacturing method Pr is performed in order to realize the configuration of the first modification, an inside of the groove V1 is filled with the resin for making the case Cs1. Therefore, the adhesion of the resin part 50 to the case Cs1 can be further increased. Accordingly, reliability during driving of the semiconductor device 100 can be increased.

Second Modification

Figure 7:
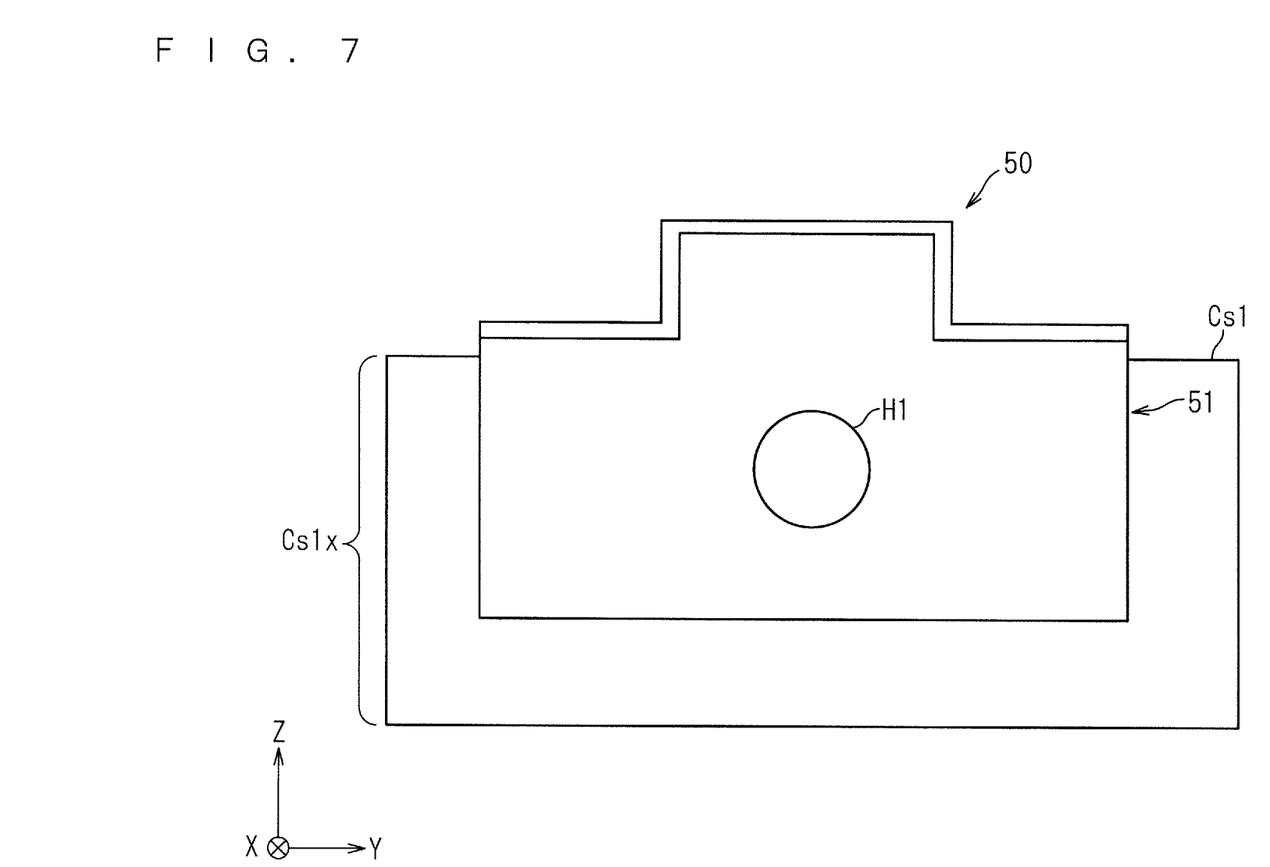
FIG. 7 is a view for describing a configuration of a second modification.

A configuration of the present modification is applied to the configuration of the first preferred embodiment. FIG. 7 is a view for describing the configuration of a second modification. In the present modification, a part of the resin part 50 embedded in the case Cs1 has another fixing portion that is fixed to a part of the case Cs1. The other relevant fixing portion is a through hole H1 that penetrates the resin part 50. That is, the resin part 50 is provided with the through hole H1. An inside of the through hole H1 is filled with a part of the section Cs1x of the case Cs1.

As described above, according to the present modification, an effect similar to that in the first modification can be obtained. When the fixing process of the foregoing manufacturing method Pr is performed in order to realize the configuration of the second modification, the inside of the through hole H1 is filled with the resin for making the case Cs1. Therefore, the adhesion of the resin part 50 to the case Cs1 can be further increased.

Third Modification

Figure 8:
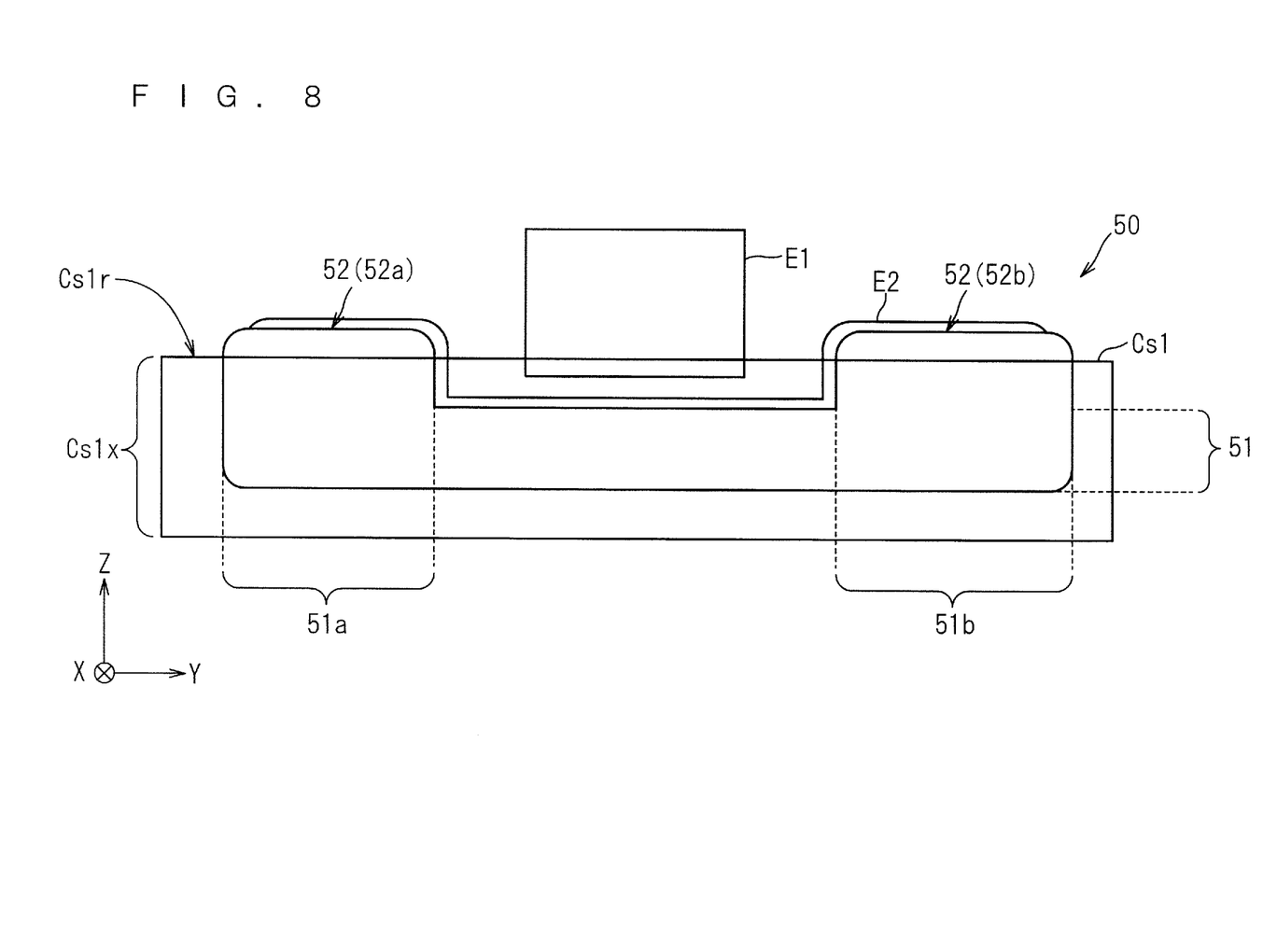
FIG. 8 is a view for describing a configuration of a third modification.

A configuration of the present modification is applied to all or a part of the first preferred embodiment, and the first and second modifications. FIG. 8 is a view for describing the configuration of a third modification. In FIG. 8, in order to make the configuration easy to understand, in regards to the section Cs1x, only an outline of the relevant section Cs1x is shown. Moreover, in FIG. 8, a part of the electrode E1 fixed to the section Cs1x is shown.

Referring to FIG. 8, the resin part 50 in the present modification has the base portion 51 and the two projecting portions 52. FIG. 8 shows, as one example, a state where the whole base portion 51 is embedded in the section Cs1x.

In the present modification, as shown in FIG. 8, the resin part 50 is disposed so that the resin part 50 straddles the electrode E1. That is, the relevant resin part 50 is provided in the section Cs1x of the case Cs1 so that the resin part 50 crosses the electrode E1 in a plan view.

Next, the configuration of the present modification will be specifically described. In the following description, the two projecting portions 52 in FIG. 8 are also referred to as projecting portions 52a, 52b, respectively. In the present modification, as shown in FIG. 8, a part of the resin part 50 is embedded in the section Cs1x of the case Cs1 so that the electrode E1 exists between the projecting portion 52a and the projecting portion 52b.

Specifically, the whole base portion 51 is embedded in the section Cs1x of the case Cs1. Moreover, a part of each of the projecting portions 52a, 52b projects from the section Cs1x of the case Cs1. Moreover, another part of each of the projecting portions 52a, 52b is embedded in the section Cs1x. The whole of each of the projecting portions 52a, 52b may project from the section Cs1x of the case Cs1.

As described above, according to the present modification, the resin part 50 is disposed so that the relevant resin part 50 straddles the electrode E1. That is, the resin part 50 is provided in the section Cs1x of the case Cs1 so that the relevant resin part 50 crosses the electrode E1 in a plan view.

This can realize, at low cost, a configuration of crossing between a plurality of different potentials, which has conventionally required much cost. Moreover, a size of the space required for providing the configuration of the crossing between the plurality of different potentials can be made small. Moreover, the configuration in which a plurality of different electrodes cross can be easily realized.

Fourth Modification

Figure 9:
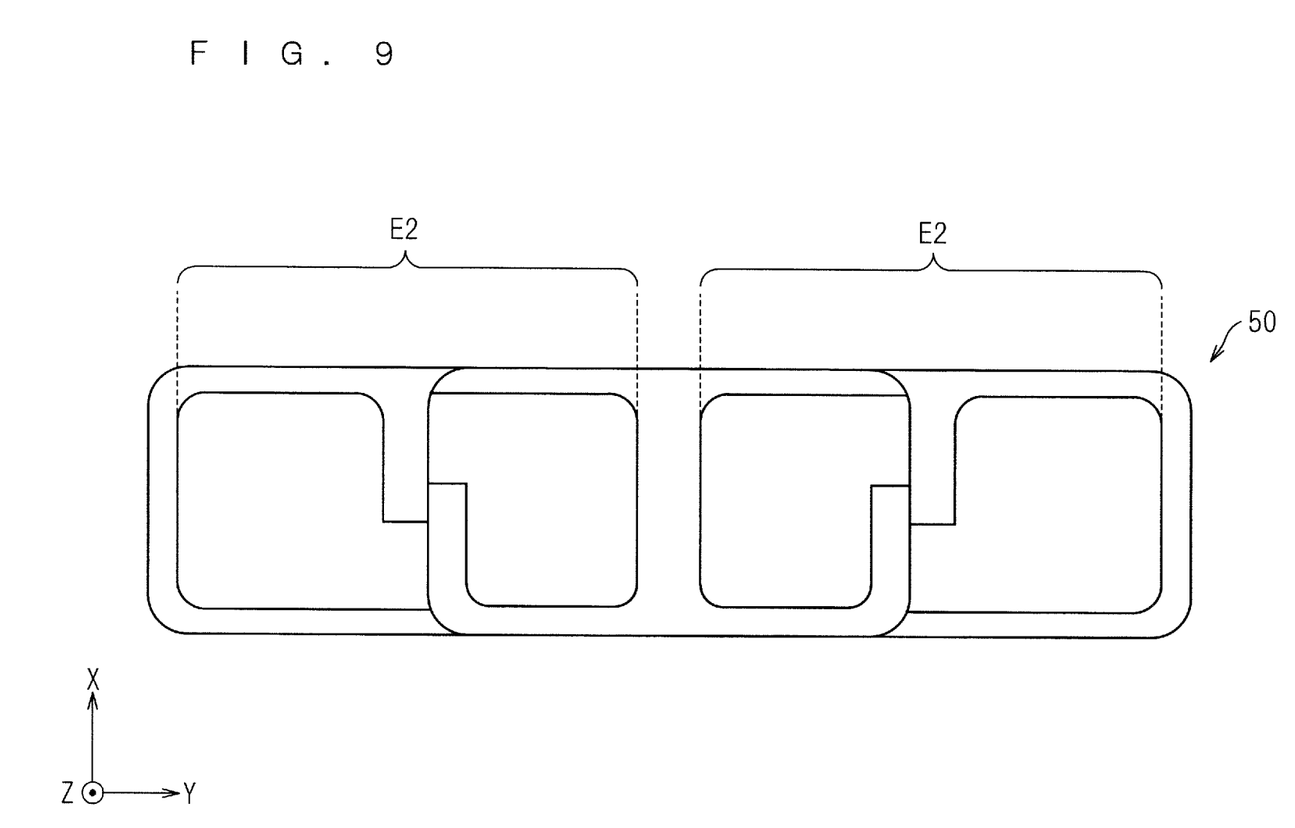
FIG. 9 is a plane view showing a resin part having a configuration of a fourth modification.

A configuration of the present modification is applied to all or a part of the first preferred embodiment, and the first, second, and third modifications. FIG. 9 is a plane view showing the resin part 50 having the configuration of a fourth modification. Referring to FIG. 9, the resin part 50 is provided with the two conductive films E2, which are wiring circuits. A number of the conductive films E2 provided in the resin part 50 may be three or more.

As described above, according to the present modification, the wiring, which has conventionally required two or more metal terminals, is enabled by the one resin part 50. Thus, the semiconductor device 100 can be downsized.

Fifth Modification

Figure 10:
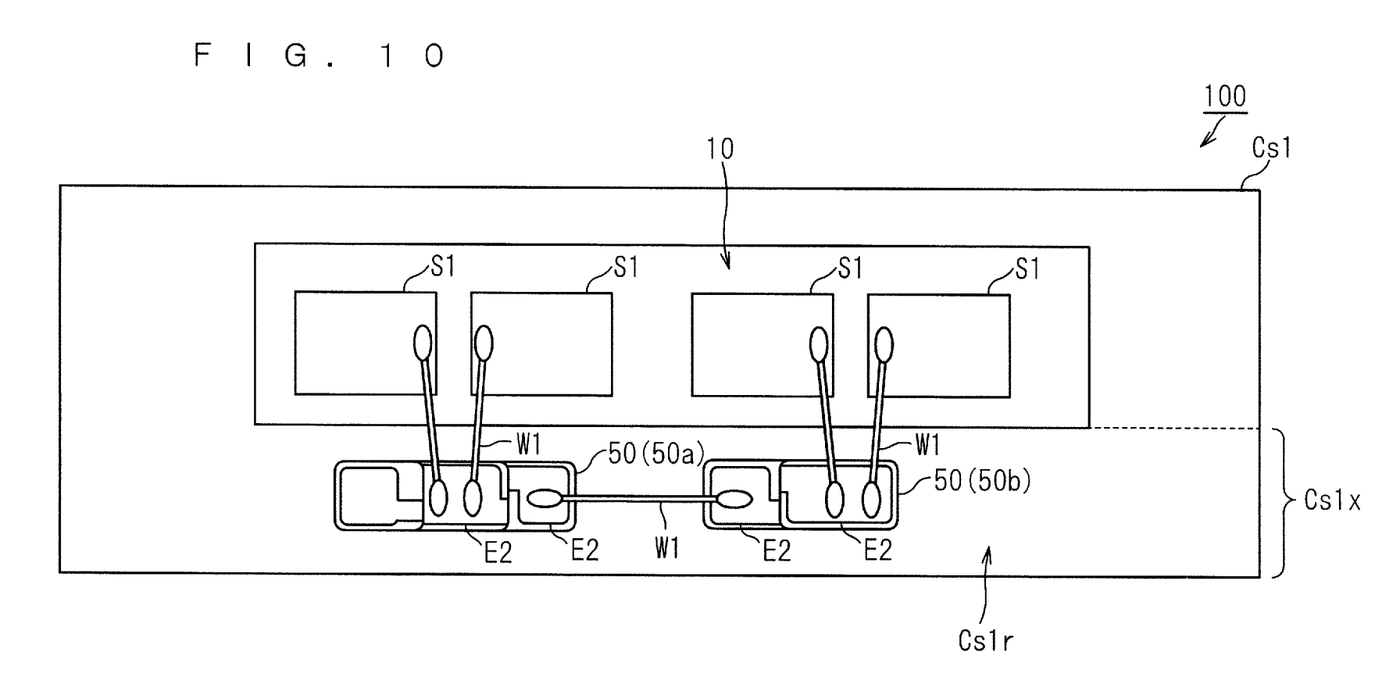
FIG. 10 is a top view of a part of a semiconductor device having a configuration of a fifth modification.

A configuration of the present modification is applied to all or a part of the first preferred embodiment, and the first, second, third, and fourth modifications. FIG. 10 is a top view of a part of the semiconductor device 100 having the configuration of a fifth modification. FIG. 10 shows a peripheral configuration of the section Cs1x of the case Cs1.

In the present modification, the plurality of resin parts 50 made of the resin are fixed to the case inside region of the case Cs1. Specifically, as shown in FIG. 10, the two resin parts 50 are fixed to the flat surface Cs1r of the section Cs1x of the case Cs1. Each of the resin parts 50 is provided with the conductive film E2, which is the wiring circuit.

A number of the resin parts 50 provided in the section Cs1x may be three or more. In the following description, the two resin parts 50 in FIG. 10 are also referred to as resin parts 50a, 50b, respectively.

In the present modification, the conductive film E2 of the resin part 50*a* is connected to the conductive films E2 of the resin part 50*b* through the wire W1.

As described above, according to the present modification, the wiring, which has conventionally been performed in the insulating substrate, can be performed in the case Cs1. Thus, the semiconductor device 100 can be downsized. Accordingly, an amount of the conductive film E2 required for the wiring can be reduced. As a result, a cost of the material of metal plating as the conductive film E2 can be reduced.

It should be noted that, within the scope of the invention, the present invention can freely combine the preferred embodiment and the modifications of the preferred embodiment, and can appropriately modify and omit the preferred embodiment and the modifications.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a case that encloses a region where at least a first member as a component of an electric circuit exists, wherein
   a resin part made of resin is fixed to an inside of the case, the inside being in contact with the region,
   the resin part is provided with a conductive film, which is a part of the electric circuit,
   the conductive film is provided in the resin part so that the conductive film comes into contact with the region,
   the conductive film is provided only in a surface of the resin part,
   the case is joined to an insulating substrate,
   the first member is fixed to an upper surface of the insulating substrate, and
   the conductive film of the resin part which is fixed to the case is spaced apart from the insulating substrate.

2. The semiconductor device according to claim 1, wherein
   a part of the resin part is embedded in the case, and
   another part of the resin part projects from the case.

3. The semiconductor device according to claim 2, wherein
   an electrode is fixed to the inside of the case, and
   the resin part is disposed so that the resin part straddles the electrode.

4. The semiconductor device according to claim 1, wherein
   a part of the resin part is embedded in the case, and
   the part of the resin part embedded in the case has a fixing portion that is fixed to a part of the case.

5. The semiconductor device according to claim 4, wherein the fixing portion is a groove provided in a side surface of the resin part.

6. The semiconductor device according to claim 4, wherein the fixing portion is a through hole that penetrates the resin part.

7. The semiconductor device according to claim 1, wherein
   the resin part is provided with a plurality of wiring circuits, and
   each of the wiring circuits is the conductive film.

8. The semiconductor device according to claim 1, wherein
   another resin part made of resin is further fixed to the inside of the case,
   the other resin part is provided with another conductive film, and
   the conductive film of the resin part is connected to the other conductive film of the other resin part through a wire.

9. The semiconductor device according to claim 1, wherein the conductive film has a solder region for joining a second member as another component of the electric circuit by solder.

10. The semiconductor device according to claim 1, wherein
    the first member is a semiconductor element, and
    the conductive film is electrically connected to the semiconductor element through a wire.

11. The semiconductor device according to claim 10, wherein the semiconductor element is made of any of Si, SiC, and GaN.

12. The semiconductor device according to claim 1, wherein
    the conductive film is metal plating, and
    the metal plating is made of any of Cu, Ni, Ag, Au, Pd, Sn, and Cr.

13. The semiconductor device according to claim 1, wherein the resin part is made of any of PPS (Polyphenylenesulfide), PC (Polycarbonate), ABS (Acrylonitrile Butadiene Styrene), PPA (Polyphthalamide), PMMA (Polymethyl methacrylate), PP (Polypropylene), TPE (Thermoplastic Elastomers), LCP (Liquid Crystal Polymer), LDPE (Low Density Polyethylene), and elastomer.

14. The semiconductor device according to claim 1, wherein the case is made of resin.

* * * * *